US006420726B2

(12) United States Patent
Choi et al.

(10) Patent No.: US 6,420,726 B2
(45) Date of Patent: Jul. 16, 2002

(54) TRIODE STRUCTURE FIELD EMISSION DEVICE

(75) Inventors: Yong-soo Choi, Seoul; Jun-hee Choi, Kyungki-do; Nae-sung Lee, Seoul; Jong-min Kim, Kyungki-do, all of (KR)

(73) Assignee: Samsung SDI Co., Ltd. (KR)

( * ) Notice: Subject to any disclaimer, the term of this patent is extended or adjusted under 35 U.S.C. 154(b) by 4 days.

(21) Appl. No.: 09/749,813

(22) Filed: Dec. 28, 2000

(30) Foreign Application Priority Data

Dec. 30, 1999 (KR) ........................................... 99-66031

(51) Int. Cl.[7] ............................................... H01L 29/06

(52) U.S. Cl. ......................... 257/10; 313/308; 313/309; 313/310; 313/336; 313/351; 313/497

(58) Field of Search .................... 257/10; 313/308–311, 313/336, 354, 422, 495, 497

(56) References Cited

U.S. PATENT DOCUMENTS

| | | | | |
|---|---|---|---|---|
| 3,671,798 | A | 6/1972 | Lees | |
| 5,772,904 | A | 6/1998 | Kim | |
| 6,313,572 | B1 * | 11/2001 | Yamada | 313/310 |

FOREIGN PATENT DOCUMENTS

| | | |
|---|---|---|
| JP | 10 255644 | 9/1998 |
| JP | 10 289650 | 10/1998 |

* cited by examiner

*Primary Examiner*—Eddie Lee
*Assistant Examiner*—Bradley William Baumeister
(74) *Attorney, Agent, or Firm*—Burns, Doane, Swecker & Mathis, L.L.P.

(57) ABSTRACT

A triode field emission device using a field emission material and a driving method thereof are provided. In this device, gate electrodes serving to take electrons out of a field emission material on cathodes are installed on a substrate below the cathodes, so that the manufacture of the device is easy. Also, electrons emitted from the field emission material are controlled by controlling gate voltage.

15 Claims, 12 Drawing Sheets

TRIODE STRUCTURE FIELD EMISSION DEVICE

BACKGROUND OF THE INVENTION

1. Field of the Invention

The present invention relates to a triode structure field emission device using carbon nanotubes that is a low voltage field emission material and a driving method thereof.

2. Description of the Related Art

FIG. 1 is a cross-sectional view schematically illustrating the structure of a conventional triode field emission device using a field emission material. As shown in FIG. 1, the conventional triode field emission device includes a rear substrate 1 and a front substrate 10 which face each other having an interval of the length of a spacer 6. Cathodes 2 on each of which a field emission material 5 is formed, gates 3 and anodes 4 are included as electron emission sources between the two substrates. The cathodes 2 are disposed on the rear substrate 1 in parallel strips, and the anodes 4 are disposed on the front substrate 10 in parallel strips to cross with the cathodes 2. The gates 3 are disposed in parallel strips to cross with the cathodes 2 so that they are arranged straightly over the anodes 4. A field emission material 5 and an aperture 3*a* are formed at places where the cathodes 2 cross with the gates 3. That is, the electron emission materials 5 are coated on the intersections on the cathodes 2, and apertures 3*a* are formed at the intersections on the gates 3, that is, at the positions on the gates 3 which correspond to the field emission materials, such that electrons emitted from the field emission materials 5 flow into the anodes 4.

As described above, field emission devices have a diode structure made up of cathodes and anodes, or a triode structure in which gates are interposed between cathodes and anodes, such that the amount of electron emitted from the cathodes is controlled. Structures in which carbon nanotubes rather than existing metal tips are applied as electron emission sources formed on cathodes have been recently attempted due to the advent of carbon nanotubes, which serve as a new field emission material. Carbon nanotubes have a large aspect ratio (which is greater than 100), electrical characteristics having conductivity such as conductors, and stable mechanical characteristics, so that they are receiving much attention of research institutions to employ them as the electron emission sources for field emission devices. Diode structure field emission devices using carbon nanotubes can be manufactured by a typical method. However, diode structure field emission devices have a trouble in controlling emitted current, in spite of the easiness of the manufacture, so that it is difficult to realize moving pictures or gray-scale images. Triode structure field emission devices using carbon nanotubes can be manufactured in consideration of installation of gate electrodes right on cathodes and installation of a grid-shaped metal sheet. The former field emission devices has difficulty in coupling carbon nanotubes to cathodes because of the arrangement of gates. The latter field emission devices have problems in that the manufacture is complicated, and control voltage increases.

SUMMARY OF THE INVENTION

To solve the above problems, an objective of the present invention is to provide a triode field emission device in which location of gate electrodes under cathodes facilitates the control of emitted current, and it is easy to coat the cathodes with a field emission material, and a driving method thereof.

To achieve the above objective, the present invention provides a triode field emission device including: a rear substrate and a front substrate which face each other at a predetermined gap; spacers for vacuum sealing the space formed by the two substrates while maintaining the gap between the two substrates; cathodes and anodes arranged in strips on the facing surfaces of the two substrates so that the cathodes cross with the anodes; electron emission sources formed on the portions of the cathodes at the intersections of the cathodes and the anodes; and gates for controlling electrons emitted from the electron emission sources, wherein the gates are arranged on the rear substrate under the cathodes, and an insulative layer for electrical insulation is formed between the gates and the cathodes.

Preferably, the gates are formed like a full surface or disposed as parallel strips on the rear substrate to cross with the cathodes so that the gates are located straightly over the anodes.

It is preferable that the electron emission sources are formed on the cathodes at the intersections of the cathodes and anodes, of at least one material selected from the group consisting of a metal, diamond and graphite, or a mixture of the selected material with a conductive material, a dielectric material or an insulative material.

Preferably, the electron emission sources are formed straight on the entire surface or one edge of cathodes at the intersections of the cathodes and gates, and the electron emission sources are formed around at least one hole pierced in the cathodes at the intersections of the cathodes and gates.

In the present invention, the electron emission sources are formed by a method among a printing method, an electrophoretic method and a vapor deposition method. It is also preferable that, when three or more holes are formed, a middle hole is formed to a dominant size, and a field emission material is formed around the outer circumference of each of the holes, so that the uniformity of emission current within a pixel is increased.

To achieve the above objective, the present invention provides a method of driving a triode field emission device including: a rear substrate and a front substrate which face each other at a predetermined gap; spacers for vacuum sealing the space formed by the two substrates while maintaining the gap between the two substrates; cathodes and anodes arranged in strips on the facing surfaces of the two substrates so that the cathodes cross with the anodes; electron emission sources formed on the portions of the cathodes at the intersections of the cathodes and the anodes; and gates for controlling electrons emitted from the electron emission sources, wherein the gates are arranged on the rear substrate under the cathodes to cross with the cathodes so that the gates are located straightly over the anodes, and an insulative layer for electrical insulation is formed between the gates and the cathodes, the method including controlling current flowing between the cathodes and the anodes by controlling the gate voltage.

Preferably, the electron emission sources are formed of at least one material selected from the group consisting of carbon nanotube, a metal, diamond and graphite, on the cathodes at the intersections of the cathodes and gates. Alternatively, the electron emission sources are formed of a mixture of a conductive material, a dielectric material or an insulative material with at least one material selected from the group consisting of carbon nanotube, a metal, diamond and graphite, on the cathodes at the intersections of the cathodes and the gates.

It is preferable that the electron emission sources are formed straight on the entire surface or one edge of cathodes at the intersections of the cathodes and gates.

Alternatively, it is preferable that the electron emission sources are formed around at least one hole pierced in the cathodes at the intersections of the cathodes and anodes.

BRIEF DESCRIPTION OF THE DRAWINGS

The above objective and advantage of the present invention will become more apparent by describing in detail a preferred embodiment thereof with reference to the attached drawings in which:

FIGS. 7 through 9 show the electrical characteristics with respect to variations in gate voltage when an anode voltage is 400 V, in an embodiment of the field emission device of FIG. 2 manufactured so that the gap between a cathode and an anode is 1.1 mm, wherein FIGS. 7 and 8 are graphs showing the anode current and the Fowler-Nordheim plot value, respectively, with respect to variations in gate voltage, and FIG. 9 is a picture of the brightness of the above actually-manufactured field emission device when half of a substrate is gated on while the remaining half is gated off;

DESCRIPTION OF THE PREFERRED EMBODIMENT

Figure 1:
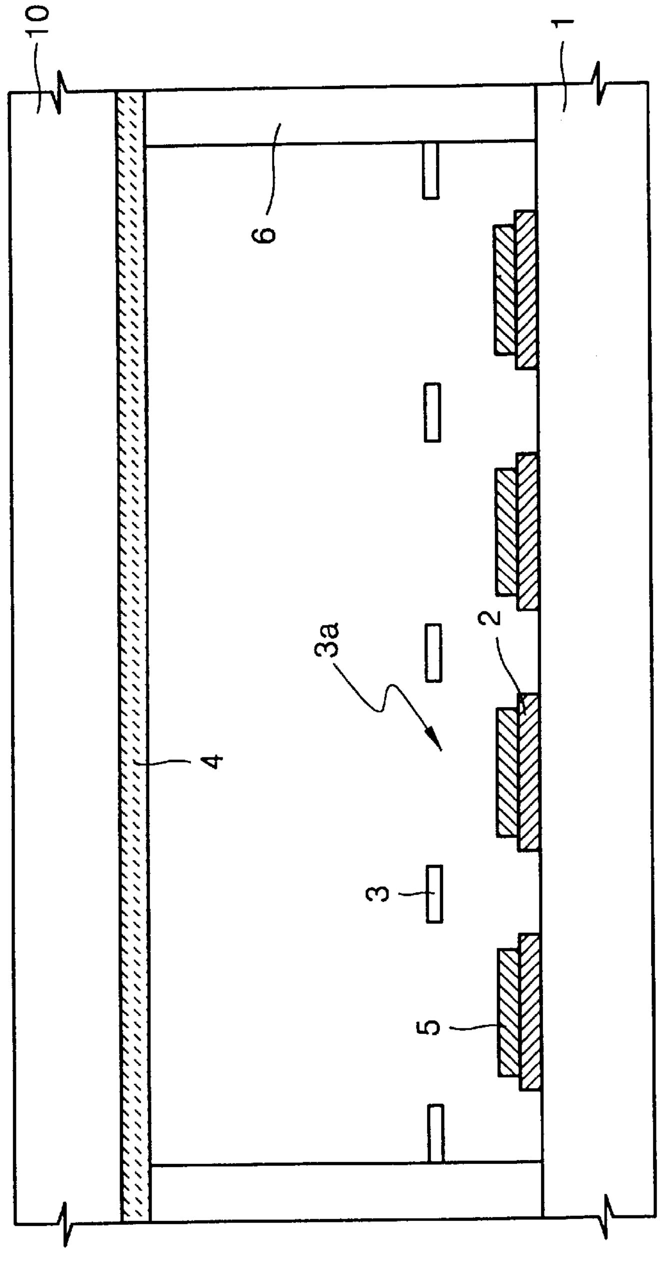
FIG. 1 (PRIOR ART)
FIG. 1 is a vertical cross-sectional view schematically illustrating the structure of a triode field emission device using a conventional field emission material.
Figure 2:
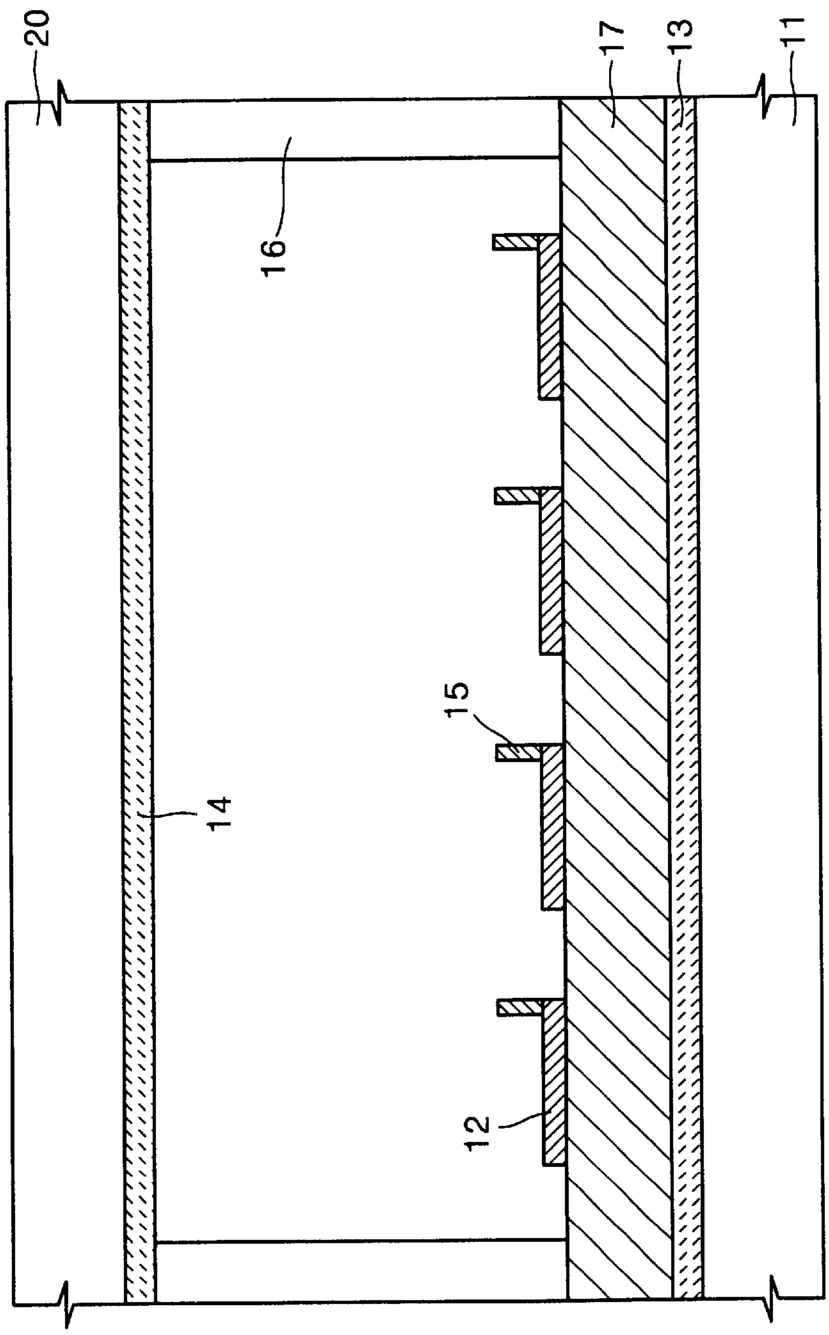
FIG. 2 is a vertical cross-sectional view schematically illustrating the structure of a triode field emission device using a field emission material according to the present invention.

FIG. 2 is a cross-sectional view schematically illustrating the structure of a triode field emission device using carbon nanotubes according to the present invention. As shown in FIG. 2, the triode field emission device according to the present invention includes a rear substrate 11 and a front substrate 20 which face each other at the interval corresponding to the length of a spacer 16. Anodes 4 and cathodes 12 on each of which an electron emission source 15 made of carbon nanotube, metal, diamond or graphite is partially formed, and anodes 14, are formed as electron emission sources between the two substrates. Gates 13 are formed below an insulative layer 17 formed below the cathodes 12. The gates 13 are formed like a full surface on the rear substrate 11 or disposed in parallel strips thereon. The insulative layer 17 is formed on the rear substrate 11 on which the gates 13 are formed. When the gates 13 are formed in strips not like a full surface, the cathodes 12 are disposed in parallel strips in the direction of crossing with the gates 13. The anodes 14 are disposed in parallel strips on the cathode-facing surface of the front substrate 20 so that they cross with the anodes 12, that is, so that they are arranged in parallel with the gates 13 straightly over the gates 13. Electron emission sources 15 made of carbon nanotube, metal, diamond or graphite are formed on the cathodes 12 at the intersections of the cathodes 12 and the gates 13.

Figure 3:
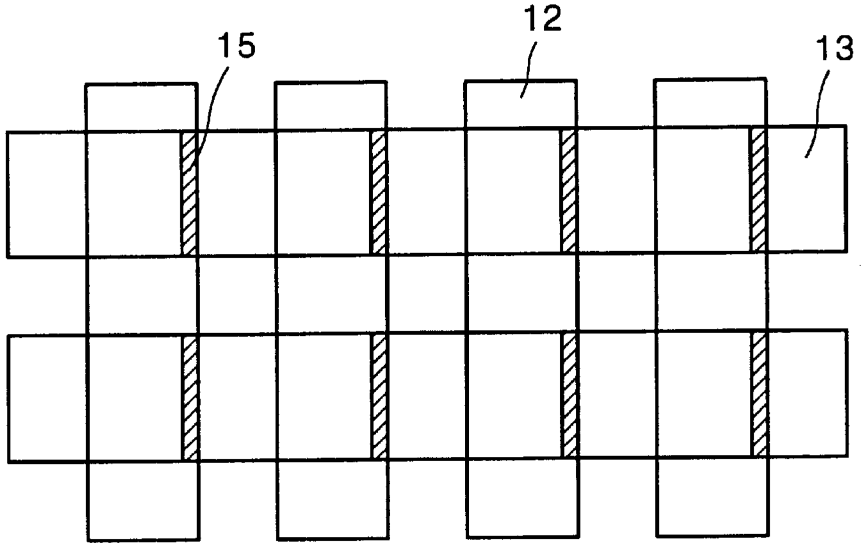
FIG. 3 is a view illustrating an embodiment of the triode field emission device using a field emission material of FIG. 2, in which the field emission material is formed on the edge of cathodes at the intersections of the cathodes and gates.
Figure 4A:
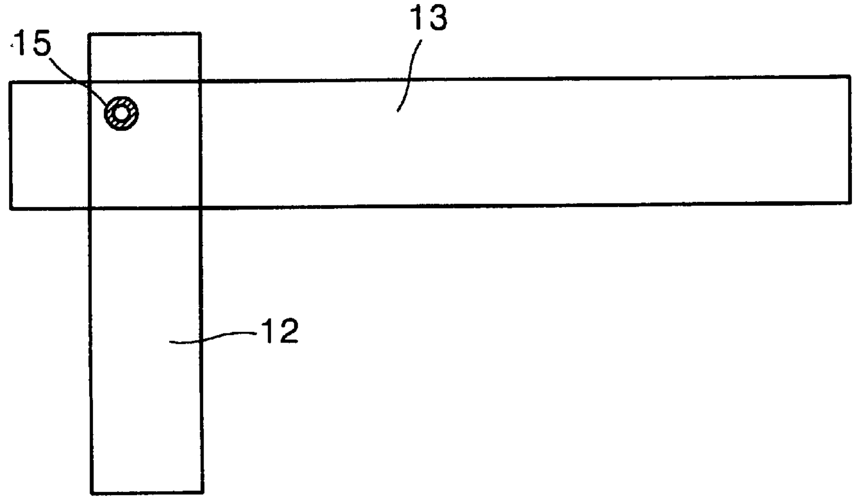
FIGS. 4A through 4D are views illustrating embodiments of the triode field emission device using a field emission material of FIG. 2, in which the field emission material is formed around at least one hole pierced on the edge of cathodes at the intersections of the cathodes and gates.
Figure 4B:
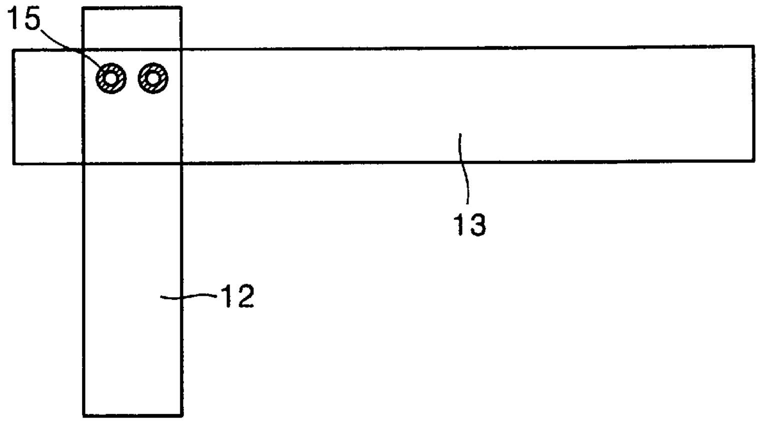
Figure 4C:
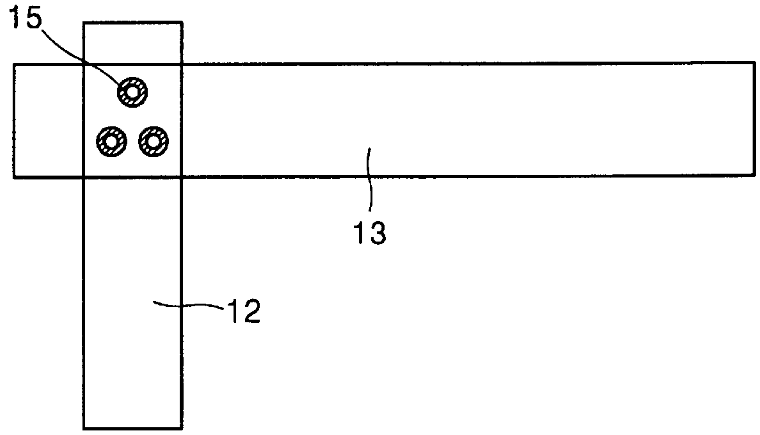
Figure 4D:
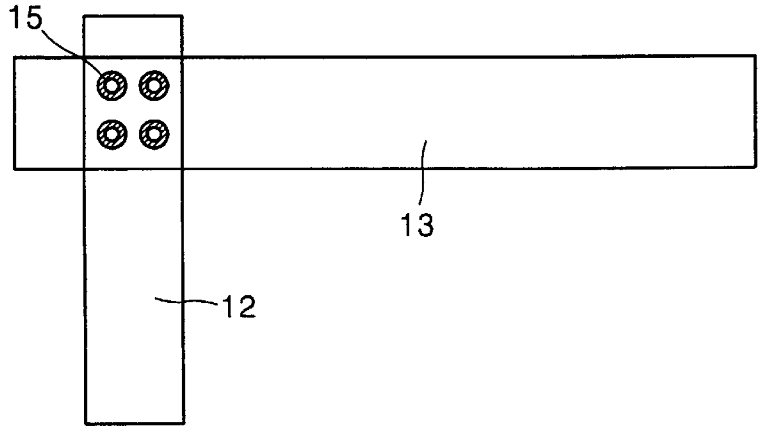

The electron emission sources 15 can be locally formed on the edge of the cathodes 12 at the intersections with the gates 13 (or anodes), as shown in FIG. 3, or formed on the entire surface of the cathodes 12. Alternatively, as shown in FIGS. 4A through 4D, the electron emission sources 15 can be locally formed around at least one hole pierced in the cathodes 12 at the intersections with the gates 13 (or anodes). As described above, the electron emission sources 15 can be formed at any positions on the cathodes at the intersections with the gates. However, the formation of the electron emission sources 15 on the edge of the cathodes has an advantage in that the strongest field is experimentally formed at the edge thereof. The electron emission sources 15 formed on the cathodes 12 can have any width compared to the line width of the cathodes 12.

FIG. 3 illustrates the case where a field emission material 15 is linearly coated on one edge of a cathode 12 at the intersection with a gate 13. FIGS. 4A through 4D illustrate the four cases where one, two, three and four holes are pierced in a cathode 12 at the intersection with a gate 13, respectively, wherein an electron emission source 15 is circularly formed around each of the holes. Here, the electron emission source 15 can also be formed in different shapes. In particular, when three or more holes are formed, a hole to be positioned in the middle is formed to a dominant size, and, preferably, a field emission material is formed around the outer circumference of each of the holes, so that the uniformity of emission current within a pixel is increased. The number of circular or different-shaped field emission material figures is controlled to obtain the maximum uniform electron emission effect at the minimum power, according to all of the conditions such as the standards such as the gap between cathodes, the gap between a cathode and a gate, and the gap between a cathode and an anode, the material of an insulative layer, and a voltage applied to each electrode.

The insulative layer 17, which insulates the gate electrode 13 from the cathode 12, can be formed in a plane or in lines along the lines of the cathodes 12. Here, when the insulative layer 17 is linearly formed, the line width of the insulative layer 17 can be equal to or larger than that of the cathode 12.

As described above, in the field emission device according to the present invention having a triode structure by which emitted current is easily controlled, gate electrodes are placed under cathodes in order to easily form electron emission materials serving as electron emission sources on the cathodes. Also, emitted current can be controlled with low voltage by field emission at the edge of cathodes, and the uniformity of emitted current can be improved by the formation of various patterns.

Figure 5A:
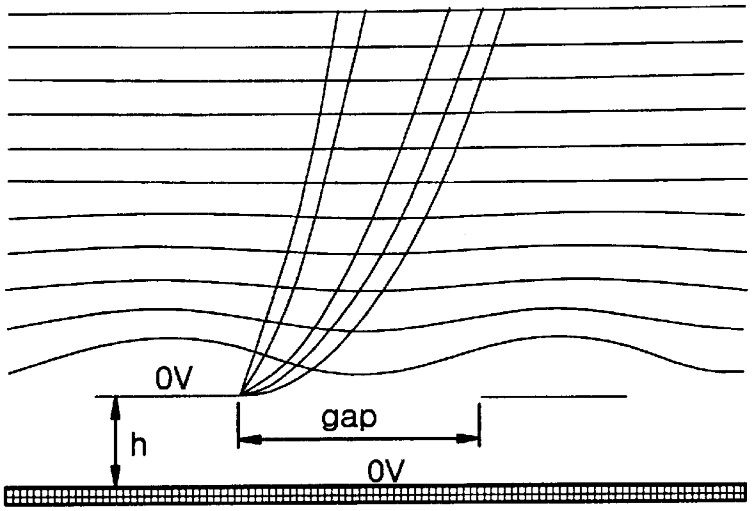
FIGS. 5A and 5B are curves illustrating an equipotential line distribution and a field distribution with respect to a gate voltage in the field emission device of FIG. 2 in which the gap between cathodes is 60 $\mu$m, an anode voltage is 500 V, the gap between a cathode and an anode is 200 $\mu$m, and the gaps (h) between cathodes and gates are identical.
Figure 5B:
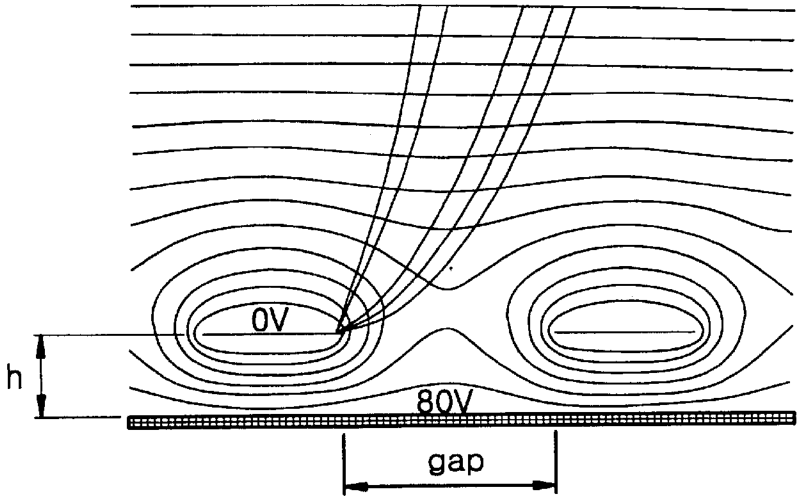

Furthermore, the gate electrodes are formed below an insulative layer formed below the cathodes, so that, if an appropriate amount of voltage is applied to the gate electrodes, an electrical field caused by the gate voltage transmits the insulative layer, and thus a strong electrical field is formed in electron emission sources. Thus, electrons are emitted by the field emission. The emitted electrons are moved toward anodes by an additional electrical field formed by an anode voltage, and serve as their functions. Curves representing an equipotential line distribution and a field distribution (an electron emission path) with respect to a gate voltage are shown FIGS. 5A and 5B. The curves are the results obtained by simulating the case that the gap between cathodes is 60 $\mu$m, an anode voltage is 500 V, the gap between a cathode and an anode is 200 $\mu$m, and the gaps (h) between cathodes and gates are identical. Here, FIG. 5A refers to the case when 0 V is applied to gates, and FIG. 5B refers to the case when 80 V is applied to the gates. Referring to the equipotential line distribution, when the gate voltage is high, that is, when 80 V is applied to the gates, the gap between equipotential lines is more narrow near cathodes than at the other portions, which means that the field strength around the cathodes is higher than that in the other portions. This infers that a greater number of electrons are emitted near the cathodes than at the other portions, as can be seen from the simulation results shown in FIGS. 6A and 6B.

Figure 6A:
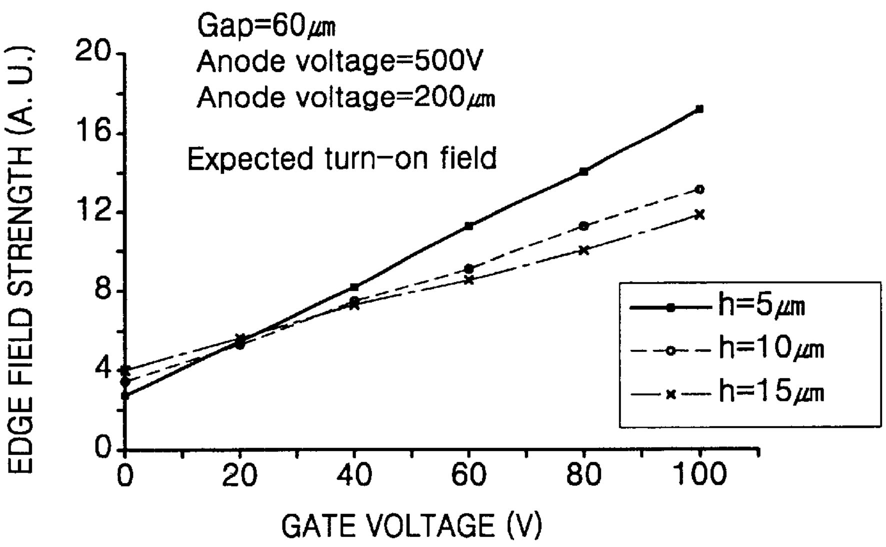
FIGS. 6A and 6B are graphs showing variations in edge field strength and deviation, respectively, with respect to voltages applied to gates in the field emission device of FIG. 2 in three cases of the gap (h) between a cathode and a gate being 5 $\mu$m, 10 $\mu$m and 15 $\mu$m with the gap between cathodes of 60 $\mu$m, an anode voltage 500 V, and the gap between a cathode and an anode of 200 $\mu$m.
Figure 6B:
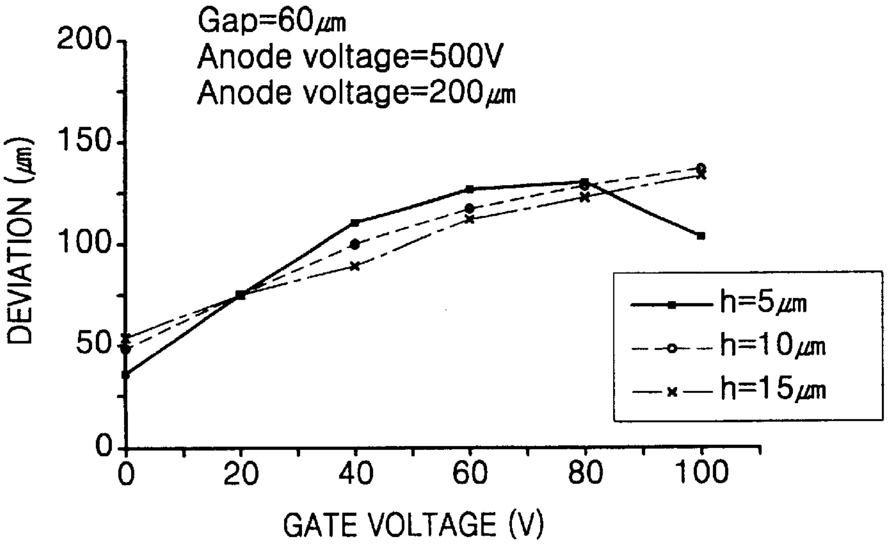

FIGS. 6A and 6B are graphs showing variations in edge field strength and horizontal deviation of emitted electrons from emission points, respectively, with respect to voltages applied to gates, in three cases of the gap (h) between a cathode and a gate being 5 $\mu$m, 10 $\mu$m and 15 $\mu$m with the gap between cathodes of 60 $\mu$m, an anode voltage 500 V, and the gap between a cathode and an anode of 200 $\mu$m as described above. As shown in FIG. 6A, the edge field strength increases as the gate voltage increases. FIG. 6B is a graph showing a deviation of electrons emitted from the edge of cathodes, with variations in gate voltage, the deviation measured from a position over anodes.

<First embodiment>

Figure 7:
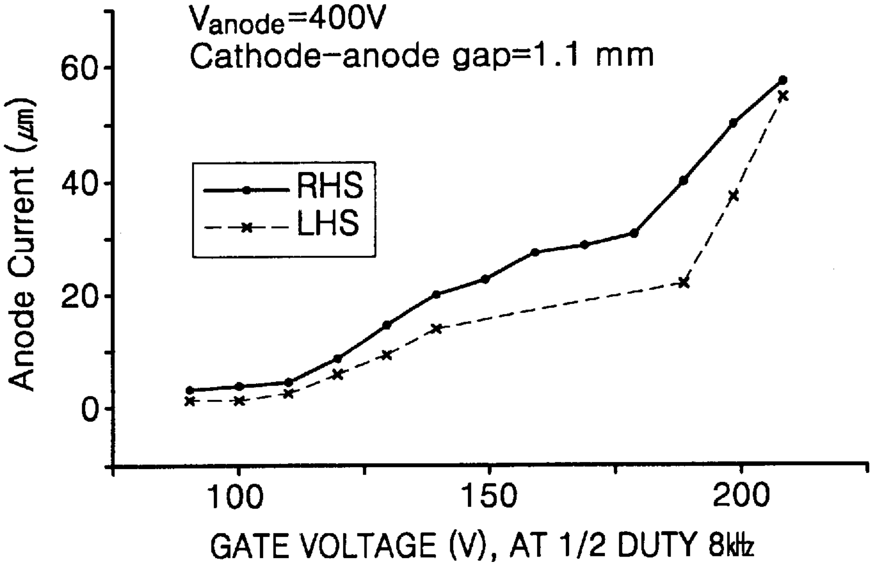
Figure 8:
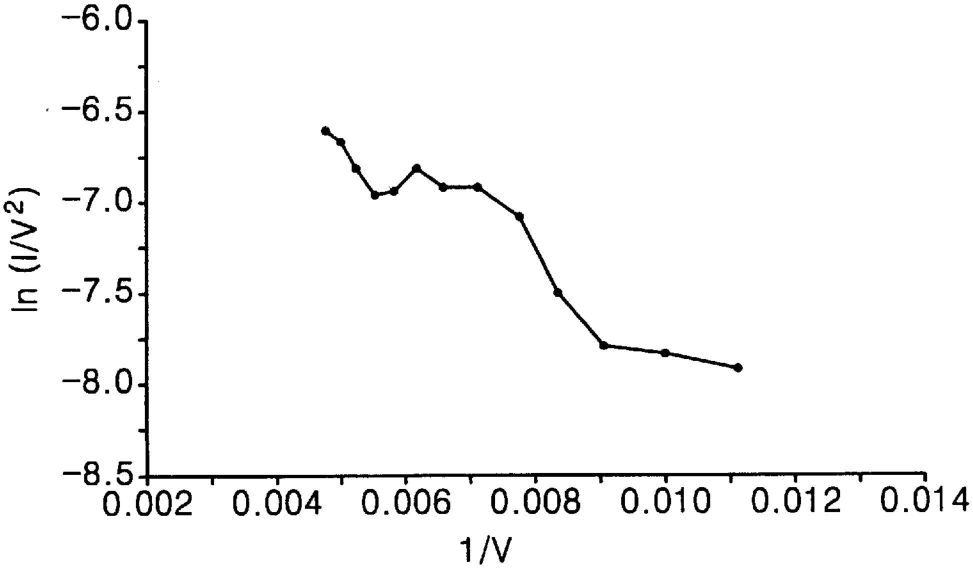
Figure 9:
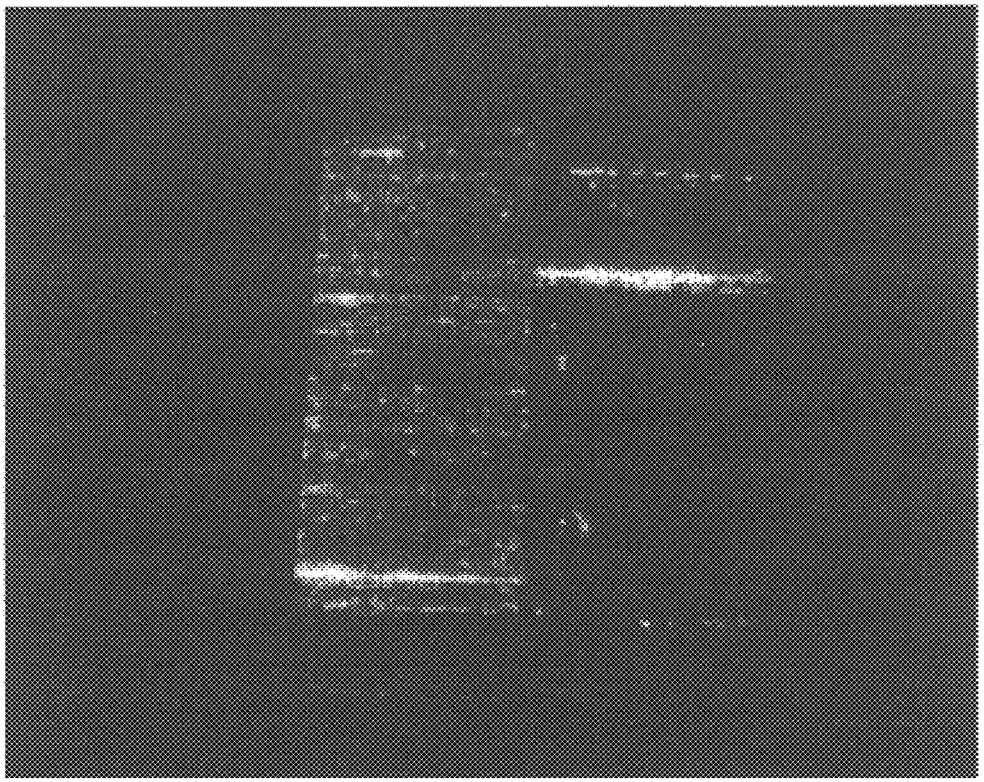

FIGS. 7 through 9 show the electrical characteristics with respect to variations in gate voltage when an anode voltage is 400 V, in a field emission device according to the present invention manufactured so that the gap between a cathode and an anode is 1.1 mm. Here, FIGS. 7 and 8 are graphs showing the anode current and the Fowler-Nordheim plot value, respectively, with respect to variations in gate voltage, and FIG. 9 is a picture of the brightness of the above actually-manufactured field emission device when half of a substrate is gated on while the remaining half is gated off. In FIG. 7, RHS denotes the right hand side, and LHS denotes the left hand side. FIG. 7 refers to the case when only the right half of a substrate is gated on and the case when only the left half of a substrate is gated on. In FIG. 8, which shows the Fowler-Norheim plot of FIG. 7, measured current is interpreted as current generated by field emission if data points exist on a line.

<Second embodiment>

Figure 10A:
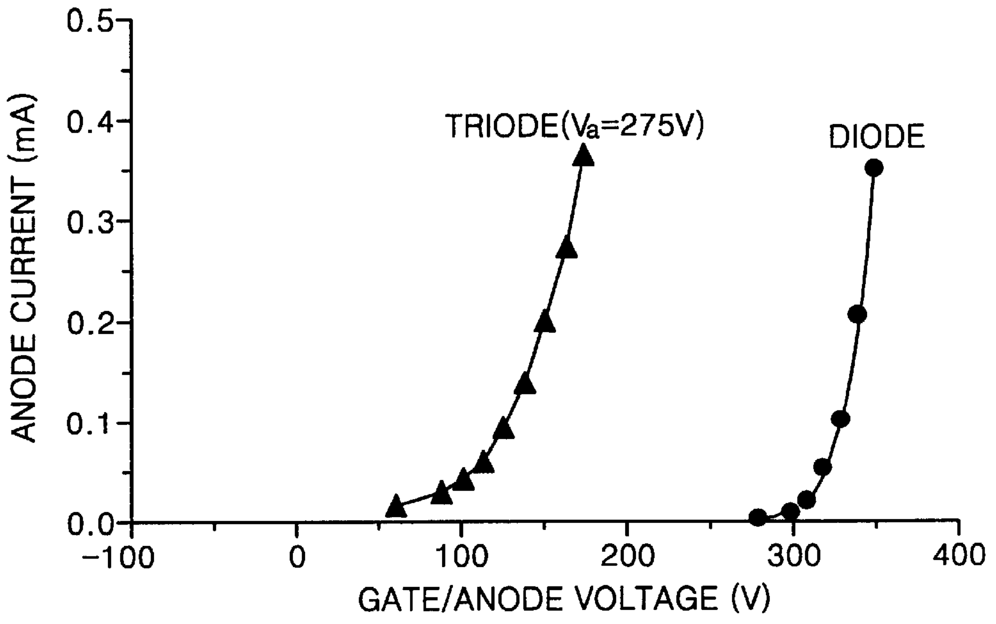
FIGS. 10A through 11B are graphs and pictures with respect to a field emission device in which the gap between a cathode and an anode is 200 $\mu$m, and cathodes are coated with a paste obtained by mixing Ag and carbon nanotubes.
Figure 10B:
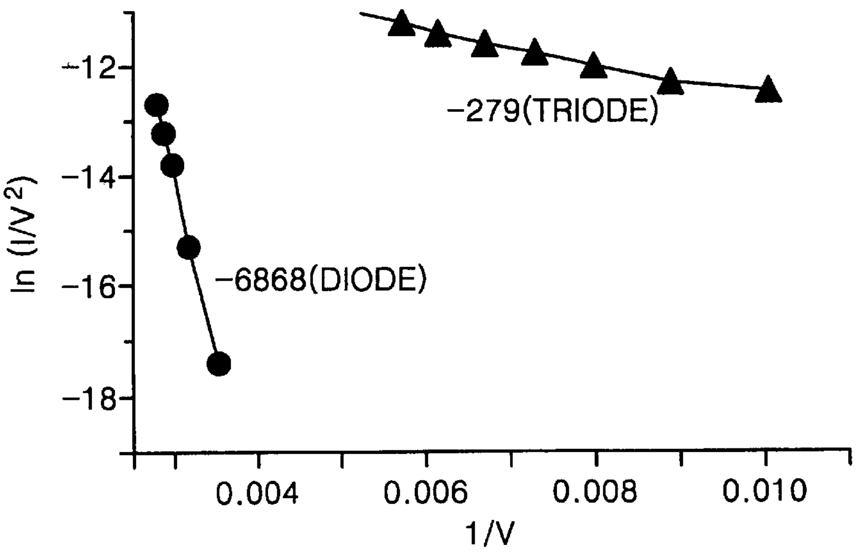
Figure 11A:
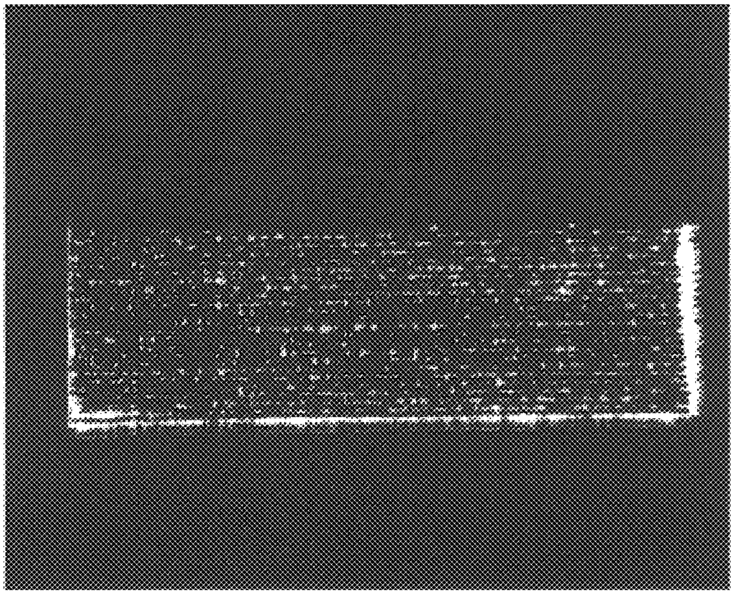
Figure 11B:
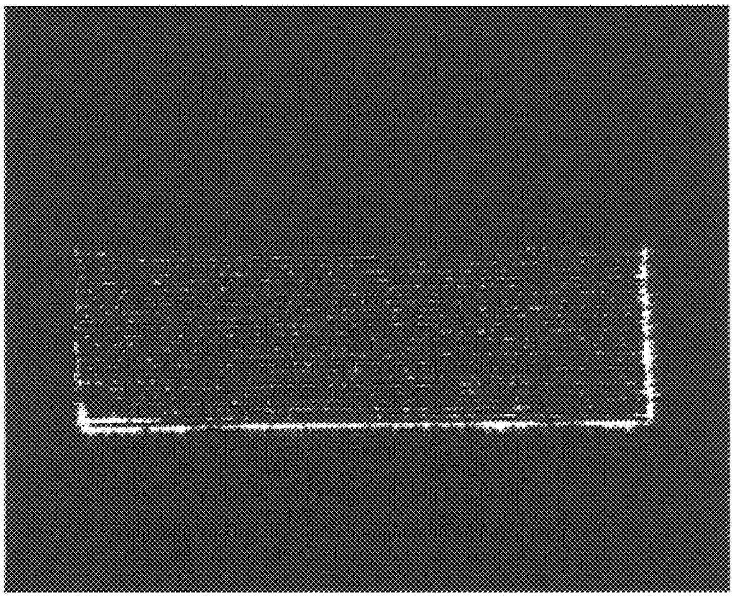

FIGS. 10A through 11B are graphs and pictures with respect to a field emission device according to the present invention manufactured so that the gap between a cathode and an anode is 200 $\mu$m, in which a paste obtained by mixing Ag and carbon nanotubes is printed on cathodes to serve as electron emission sources. Here, FIG. 10A shows the intensity of anode current with variations in gate voltage, and FIG. 10B is a graph showing the Fowler-Norheim plot of FIG. 7. FIG. 11A is a picture of the brightness of a diode field emission device when an anode voltage is 500 V, and FIG. 11B is a picture of the brightness of a triode field emission device at a gate voltage of 120 V, when anodes are biased by 250 V.

<Third embodiment>

Figure 12:
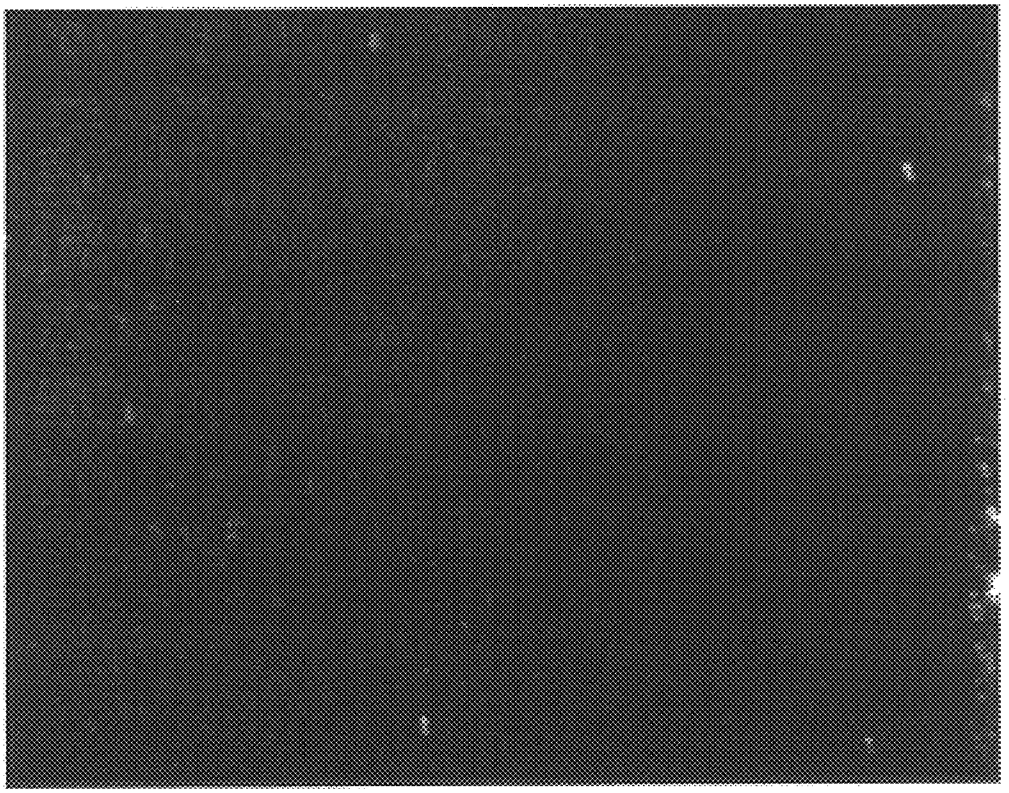
FIG. 12 is a picture with respect to a triode field emission device in which the gap between a cathode and an anode is 1.1 mm, and cathodes are coated with a paste obtained by mixing glass and carbon nanotubes.

FIG. 12 is a picture with respect to a triode field emission device according to the present invention manufactured so that the gap between a cathode and an anode is 1.1 mm, in which a paste obtained by mixing glass and carbon nanotubes is printed on the cathodes to serve as electron emission sources. Here, an anode voltage is DC 700 V, and a gate voltage is AC 300 V (130 Hz, 1/100 duty). FIG. 12 refers to the case when only the left half of a substrate is gated on.

<Fourth embodiment>

Figure 13A:
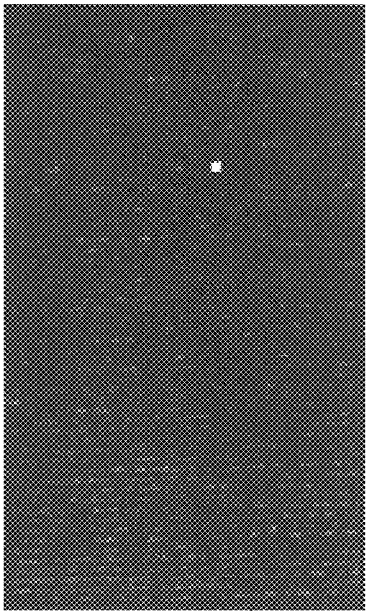
FIGS. 13A and 13B are pictures of the brightness of a triode field emission device in two cases, that is, when insulative layers between gates and cathodes are formed in strips along the cathodes, and when the insulative layer is formed in the form of a plane, respectively.
Figure 13B:
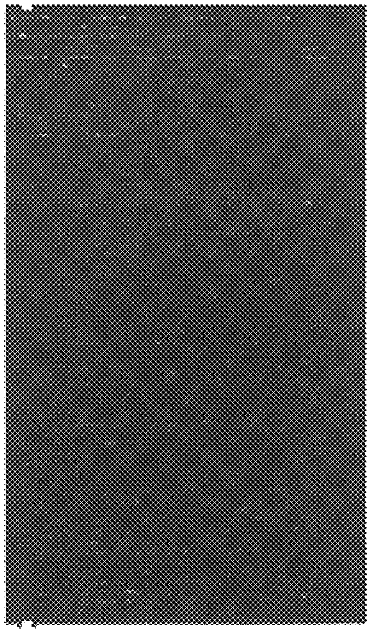

FIGS. 13A and 13B are pictures of the brightness of a triode field emission device in two cases, that is, when insulative layers between gates and cathodes are formed in strips along the cathodes, and when the insulative layer is formed in a plane, respectively. In the two cases, an anode voltage is DC 500 V. As shown in FIG. 13A, in the case when the insulative layer is linearly formed, the uniformity of field emission is improved, and an operation voltage (which is 160 V in the case of linear formation of the insulative layer, or 240 V in the case of blanket formation of the insulative layer) increases.

In the manufacture of this field emission device, first, gate electrode lines in strips are formed on a substrate, and then an insulating material having a constant thickness (about several to several tens of $\mu$m) is entirely or locally coated on the gate electrode lines. Next, cathode lines are formed on the insulative layer to cross with the gate electrodes. Then, carbon nanotubes are coupled to the edge of each of the cathodes at the dot area where the gate electrodes are overlapped by the cathodes, by a printing method, an electrophoretic method or a vapor deposition method. Alternatively, carbon nanotubes are formed around holes pierced in the dot area where the gate electrodes are overlapped by the cathodes. Thereafter, anodes and the resultant substrate are vacuum sealed using spacers by a typical method.

As described above, in a triode field emission device using carbon nanotubes according to the present invention, gate electrodes serving to take electrons out of carbon nanotubes on cathodes are installed below the cathodes on a substrate, so that the manufacture of the devices is easy. However, in all existing triode electron emission devices, gate electrodes are interposed between cathodes and anodes. In the present invention, the gate electrodes are formed below an insulative layer formed below the cathodes, so that, if an appropriate amount of voltage is applied to the gate electrodes, an electrical field caused by the gate voltage transmits the insulative layer, and thus a strong electrical field is formed in carbon nanotubes. Thus, the carbon nanotubes can control the emission of electrons due to the field emission. The emitted electrons are moved toward anodes by an additional electrical field formed by an anode voltage, and serve as their functions. Field emission devices having such a structure can be simply manufactured by present techniques, and driven at low voltage and enlarged because of the use of carbon nanotubes as electron emission sources. Therefore, these field emission devices receive much attention for their potential to serve as next-generation flat display devices.

What is claimed is:

1. A triode field emission device comprising:

a rear substrate and a front substrate which face each other at a predetermined gap;

spacers for vacuum sealing the space formed by the two substrates while maintaining the gap between the two substrates;

cathodes and anodes arranged in strips on the facing surfaces of the two substrates so that the cathodes cross with the anodes;

electron emission sources formed on the portions of the cathodes at the intersections of the cathodes and the anodes; and gates for controlling electrons emitted from the electron emission sources, wherein the gates are arranged on the rear substrate under the cathodes, and an insulative layer for electrical insulation is formed between the gates and the cathodes.

2. The triode field emission device of claim 1, wherein the gates are arranged in strips on the rear substrate to cross with the cathodes so that the gates are located straightly over the anodes.

3. The triode field emission device of claim 1, wherein the electron emission sources are formed of at least one material selected from the group consisting of a metal, diamond and graphite, on the cathodes at the intersections of the cathodes and anodes.

4. The triode field emission device of claim 1, wherein the electron emission sources are formed of a mixture of a conductive material, a dielectric material or an insulative material, and at least one material selected from the group consisting of carbon nanotube, a metal, diamond and graphite, on the cathodes at the intersections of the cathodes and the gates.

5. The triode field emission device of claim 3, wherein the electron emission sources are formed straight on the entire surface or one edge of cathodes at the intersections of the cathodes and gates.

6. The triode field emission device of claim 3, wherein the electron emission, sources are formed around at least one hole pierced in the cathodes at the intersections of the cathodes and gates.

7. The triode field emission device of claim 3, wherein the electron emission sources are formed by a method among a printing method, an electrophoretic method and a vapor deposition method.

8. The triode field emission device of claim 6, wherein, when three or more holes are formed, a middle hole is formed as large as possible, and a field emission material is formed around the outer circumference of each of the holes, so that the uniformity of emission current within a pixel is increased.

9. The triode field emission device of claim 1, wherein the insulative layer is formed in a blanket or linearly formed along the lines of the cathodes.

10. A method of driving a triode field emission device including:

a rear substrate and a front substrate which face each other at a predetermined gap;

spacers for vacuum sealing the space formed by the two substrates while maintaining the gap between the two substrates;

cathodes and anodes arranged in strips on the facing surfaces of the two substrates so that the cathodes cross with the anodes;

electron emission sources formed on the portions of the cathodes at the intersections of the cathodes and the anodes, to serve as electron emission sources; and gates for controlling electrons emitted from the electron emission sources, wherein the gates are arranged on the rear substrate under the cathodes to cross with the cathodes so that the gates are located straightly over the anodes, and an insulative layer for electrical insulation is formed between the gates and the cathodes, the method comprising controlling current flowing between the cathodes and the anodes by controlling the gate voltage.

11. The method of claim 10, wherein the electron emission sources are formed of at least one material selected from the group consisting of carbon nanotube, a metal, diamond and graphite, on the cathodes at the intersections of the cathodes and gates.

12. The method of claim 10, wherein the electron emission sources are formed of a mixture of a conductive material, a dielectric material or an insulative material, and at least one material selected from the group consisting of carbon nanotube, a metal, diamond and graphite, on the cathodes at the intersections of the cathodes and the gates.

13. The method of claim 10, wherein the insulative layer is formed in a blanket or linearly formed along the lines of the cathodes.

14. The method of claim 11, wherein the electron emission sources are formed straight on the entire surface or one edge of cathodes at the intersections of the cathodes and gates.

15. The method of claim 11, wherein the electron emission sources are formed around at least one hole pierced in the cathodes at the intersections of the cathodes and anodes.

* * * * *